(12) United States Patent
Pitault

(10) Patent No.: US 7,807,010 B2
(45) Date of Patent: Oct. 5, 2010

(54) METHOD FOR PRODUCING AN ARRAY FOR DETECTING ELECTROMAGNETIC RADIATION, ESPECIALLY INFRARED RADIATION

(75) Inventor: Bernard Pitault, Saint Etienne de Crossey (FR)

(73) Assignee: Societe Francaise de Detecteurs Infrarouges - Sofradir (FR)

( * ) Notice: Subject to any disclaimer, the term of this patent is extended or adjusted under 35 U.S.C. 154(b) by 220 days.

(21) Appl. No.: 12/108,944

(22) Filed: Apr. 24, 2008

(65) Prior Publication Data
US 2009/0321013 A1 Dec. 31, 2009

(30) Foreign Application Priority Data
Apr. 25, 2007 (FR) .................... 07 54677

(51) Int. Cl.
*C09J 5/06* (2006.01)
(52) U.S. Cl. .................. 156/305; 156/297; 156/299; 156/285
(58) Field of Classification Search .............. 250/339.2; 156/285, 305, 297, 299; 438/455
See application file for complete search history.

(56) References Cited

U.S. PATENT DOCUMENTS

| | | | | |
|---|---|---|---|---|
| 4,039,833 A | * | 8/1977 | Thom | .................. 250/332 |
| 5,270,255 A | | 12/1993 | Wong | |
| 5,308,980 A | * | 5/1994 | Barton | .................. 250/338.4 |
| 6,967,412 B2 | * | 11/2005 | Standing | .................. 257/787 |
| 2002/0166625 A1 | * | 11/2002 | Ball et al. | .................. 156/247 |
| 2004/0104488 A1 | | 6/2004 | Tao et al. | |

FOREIGN PATENT DOCUMENTS

FR 2857504 1/2005

* cited by examiner

*Primary Examiner*—Khanh Nguyen
*Assistant Examiner*—Vishal I Patel
(74) *Attorney, Agent, or Firm*—Cantor Colburn LLP

(57) ABSTRACT

Disclosed is a method for producing an array for detecting electromagnetic radiation, the array including a elementary detection modules mounted on an interconnect substrate, the modules comprising at least one circuit for detecting the radiation, connected to a read circuit by hybridization, the read circuits being attached to the interconnect substrate, the method including making, on the rear face of read circuit of each of the elementary modules grooves or slots, and areas without such grooves or slots; mounting, on the front face of the interconnect substrate, and on the front face of the detection circuit, registration features that ensure accurate positioning of each of the elementary modules on the interconnect substrate; pressing each elementary module onto the interconnect substrate after positioning; ensuring migration of the adhesive through grooves or slots; raising the temperature of the chamber used to produce the array to cure of the adhesive.

6 Claims, 6 Drawing Sheets

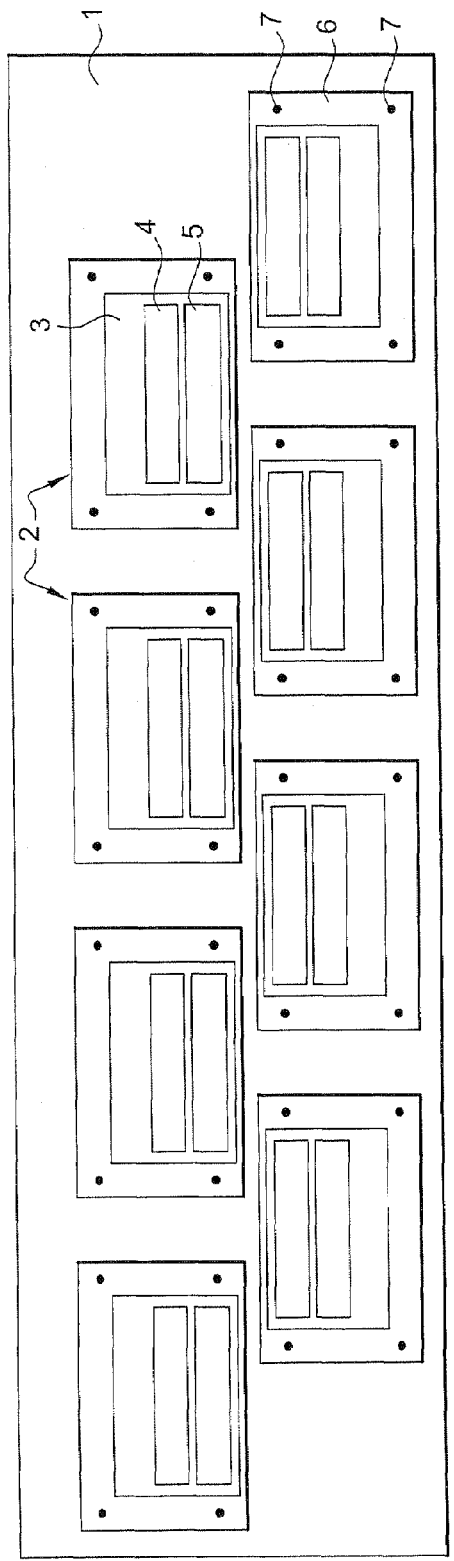
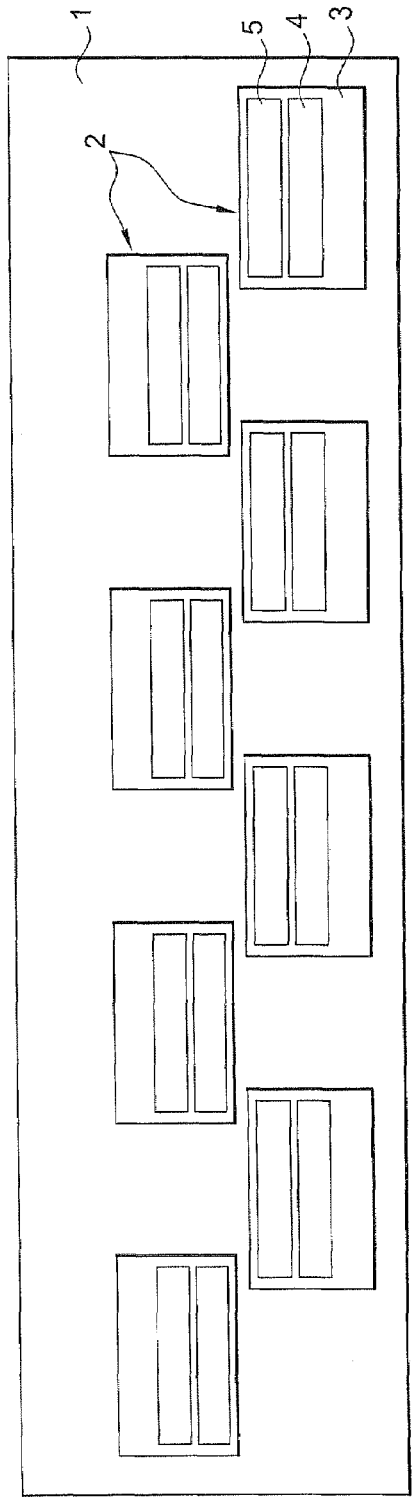

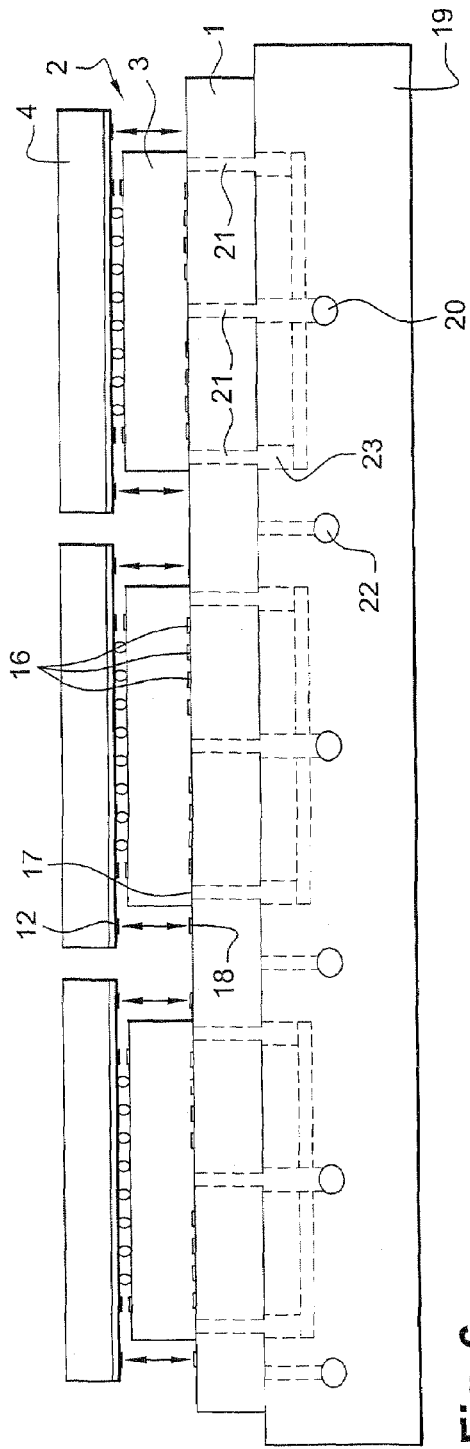
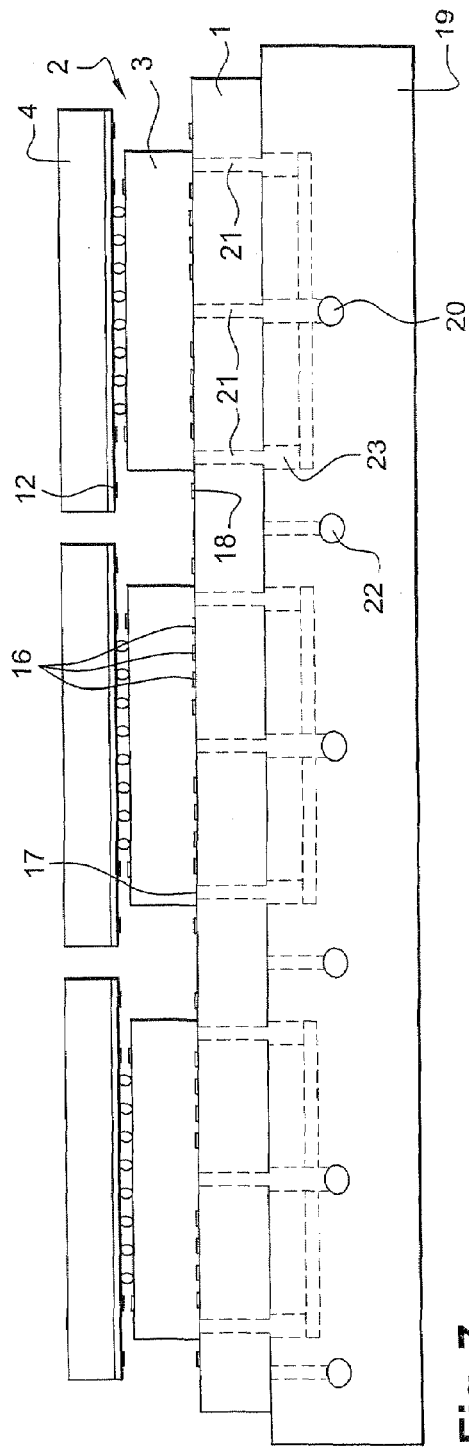
Fig. 6
Fig. 7

METHOD FOR PRODUCING AN ARRAY FOR DETECTING ELECTROMAGNETIC RADIATION, ESPECIALLY INFRARED RADIATION

FIELD OF THE INVENTION

The present invention relates to a method for producing an array for detecting electromagnetic radiation. It relates, more particularly, to the production of infrared radiation detectors.

More especially, it relates to the production of such arrays having a relatively large focal plane, typically greater than 100 mm.

DESCRIPTION OF THE PRIOR ART

Electromagnetic radiation detectors conventionally consist of a circuit for detecting said waves to be detected and are therefore sensitive to the corresponding wavelength range and convert, in a known manner, electromagnetic radiation into an electrical signal. This detection circuit is associated with an electronic read circuit designed to convert the electrical signals output by the detection circuit in order to make them suitable for subsequent processing, in particular after amplification.

Also in a known manner, both the mechanical and electrical connection between the detection circuit and the read circuit is obtained using hybridization technology which employs bumps or microbumps and is also referred to as "flip chip" technology. These bumps or microbumps are made of indium or even a tin-lead alloy.

The detection circuit traditionally comprises a material which is transparent to or relatively non-absorbent of the radiation to be detected and consisting, for instance, of CdTe, CdZnTe or even germanium, on which a thin absorbent layer of HgCdTe which constitutes the actual detection circuit is deposited by liquid, vapor or even molecular jet epitaxy.

The read circuit is usually made of silicon.

These various technologies have now been fully mastered.

Nevertheless, changes observed in the field of detection, more especially in the spatial domain, require the use of extremely large focal planes, typically in excess of 100 mm. This makes it necessary, as far as the actual sensing element is concerned, to use several elementary detection modules placed end to end or in staggered rows. However, such detection systems involve a certain number of requirements associated, in particular, with focusing and reconstituting a linear detector array having very large dimensions; these requirements impose constraints on the relative positioning of the various elementary modules in the two dimensions of the plane in which they are located (X, Y dimensions) and also on variation in the Z-axis dimension, i.e. in the direction perpendicular to the plane of the various diodes which constitute the focal plane.

Among the technical solutions which have been proposed so far, the first one was to mechanically fix the various elementary modules which constitute the focal plane by screw fastening or clamping them onto the interconnect network or interconnect substrate. This technology is illustrated in FIG. 1. Reference 1 denotes the interconnect substrate and reference 2 denotes the various elementary modules mounted in staggered rows in order to build up the linear detector array.

Each of these modules 2 comprises a read circuit 3 and, in the example described, two detection circuits 4, 5 which correspond to two different wavelength ranges. Each of the modules 2 is bonded on a support 6, typically made of molybdenum, because it is not possible to screw fasten or clamp 7 directly onto the read circuit.

Bonding elementary module 2 on support 6 actually produces variation in the Z-axis dimension in the location of the various photosites which affects accuracy in said dimension and affects the quality of eventual detection. Moreover, this implementation method requires the use of extremely accurate mounting tools in order to position the assemblies consisting of elementary modules bonded on supports on the interconnect substrate and, in particular, the use of alignment patterns which are tricky to use.

All the more so because of the various thermal cycles to which such detectors are subjected, the reader being reminded that they are designed to operate at low temperatures from 50 K to 200 K with frequent warming up to ambient temperature (20° C.) or even higher (80° C.) in the case of decontamination baking. The rigid joint created between the read circuit and the support which are made of materials having average coefficients of thermal expansion which differ slightly over this temperature range results in the formation of a bimetal which results in tensile/compression/sheer stresses on the indium bumps and these stresses may result in connections failing, especially at the extreme end bumps. Not only this, positioning obtained by mechanical clamping carried out at ambient temperature may change when the temperature drops and result in positional changes on the X- and Y-axes.

Physical retention of the various elementary modules by bonding has also been suggested (see FIG. 2). With this technology, each of the elementary modules 2 is positioned on interconnect network or interconnect substrate 1 and secured in position by curing a bed of adhesive deposited between read circuit 3 and said interconnect substrate.

Here too, this method involves using extremely accurate mounting tools of the same type as those mentioned above. What is more, changes in the positioning of each elementary module are observed during the adhesive curing cycle and these produce, in particular, variations on the X- and Y-axes. It is also very difficult to control the average thicknesses of the various bonding layers and their homogeneity and this inevitably results in variations along the Z-axis.

Finally, a method of fixing elementary modules 2 on interconnect substrate 1 by hybridization using flip chip technology has also been proposed (see FIG. 3). Positional retention can, in this case, be improved by curing an adhesive which has been made to spread between read circuit 3 and interconnect network 1 (underfilling) but this only improves retention. This technology admittedly makes it possible to achieve a high degree of accuracy but, on the other hand, it is especially expensive to implement insofar as this mounting method makes it necessary to produce metal attachment contacts 11 on the rear face of read circuit 3, with these contacts acting as a wetting surface and being used to attach the indium bumps 9 produced on the interconnect network which also has attachment contacts 10. In fact, it is necessary to have a double-sided mask aligner in order to ensure perfect alignment of the etched features on the front face of the interconnect network and the rear face of the read circuit.

SUMMARY OF THE INVENTION

The invention proposes a new method which makes it possible to ensure accurate positioning and retention of various elementary modules on the substrate or interconnect network without thereby complicating actual realization unacceptably.

This method for producing an array for detecting electromagnetic radiation, especially infrared radiation, said array consisting of a plurality of elementary detection modules mounted on an interconnect substrate and said modules themselves comprising at least one circuit for detecting said radiation, connected to a read circuit by hybridization, said read circuits themselves being attached to the interconnect substrate, involves:

- making, on the rear face of the read circuit of each of the elementary modules:
  - grooves or slots designed to allow migration of an adhesive capable of ensuring attachment of said modules on the interconnect substrate,
  - and areas without such grooves or slots in order to allow direct contact between said modules and said interconnect substrate;
- mounting, firstly on the front face of the interconnect substrate, and secondly on the front face of the detection circuit, registration features capable of ensuring accurate positioning, especially on the X and Y axes, of each of the elementary modules on said interconnect substrate;
- bringing about pressing of each of the modules onto the interconnect substrate after positioning of said modules, the areas which have no grooves or slots on the rear face of the read circuit then being in direct contact with the interconnect substrate;
- ensuring migration of the adhesive through the grooves or slots provided for this purpose;
- raising the temperature of the chamber used to produce said array in order to cause curing of the adhesive.

In other words, the invention involves, firstly, achieving accurate registration by using features etched or mounted on the front face of the interconnect network and the front face of the detection circuit in particular and, secondly, ensuring direct contact, without any support or adhesive, between the rear face of the read circuit and the interconnect network with retention nevertheless being obtained by bonding through slots or openings made in said rear face of the read circuit, positional accuracy being preserved throughout the process when the adhesive is cured by effectively keeping said modules pressed against the interconnect substrate.

According to one aspect of the invention, this pressing is obtained by subjecting the modules on the interconnect substrate to negative pressure or suction, the interconnect substrate being pierced by pipes connected to one or more vacuum or suction sources, said pipes emerging on the front face of the interconnect substrate in line with those areas of the rear face of the elementary modules which have no grooves or slots.

According to the invention, the elementary modules are produced and, in particular, the detection circuit(s) is/are also aligned on a single read circuit with the aid of registration features located respectively on the front face of the read circuit and on the rear face of the detection circuit(s).

In addition and according to an aspect of the invention, at least one of the detection circuits of a single elementary module is long enough to project either side of said module in order to make it possible to produce, on its front face, a registration feature allowing it to be accurately positioned on the registration substrate which also has, as stated above, registration features.

According to one variant, a component long enough to also project either side of the read circuit is mounted on the read circuit, this component is simply designed to accommodate such a registration feature, this component being temporarily hybridized on the read circuit.

BRIEF DESCRIPTION OF THE DRAWINGS

The way in which the invention can be implemented and its resulting advantages will be made more readily understandable by the descriptions of the following embodiments, given merely by way of example, reference being made to the accompanying drawings.

FIG. 1 is a schematic top view of a technology according to the prior art which uses mechanical clamping or screw fastening to attach the elementary modules to the interconnect substrate.

FIG. 2 which is also described above is a schematic view of a technology according to prior heart, viewed from above, which uses technology which involves bonding the elementary modules on the registration substrate.

FIG. 6 is a schematic cross-sectional view showing positioning of the elementary modules on the interconnect substrate in accordance with the invention.

FIG. 7 shows the next stage of positioning and securing the elementary modules on the interconnect substrate.

DESCRIPTION OF THE PREFERRED EMBODIMENTS

Figure 3:
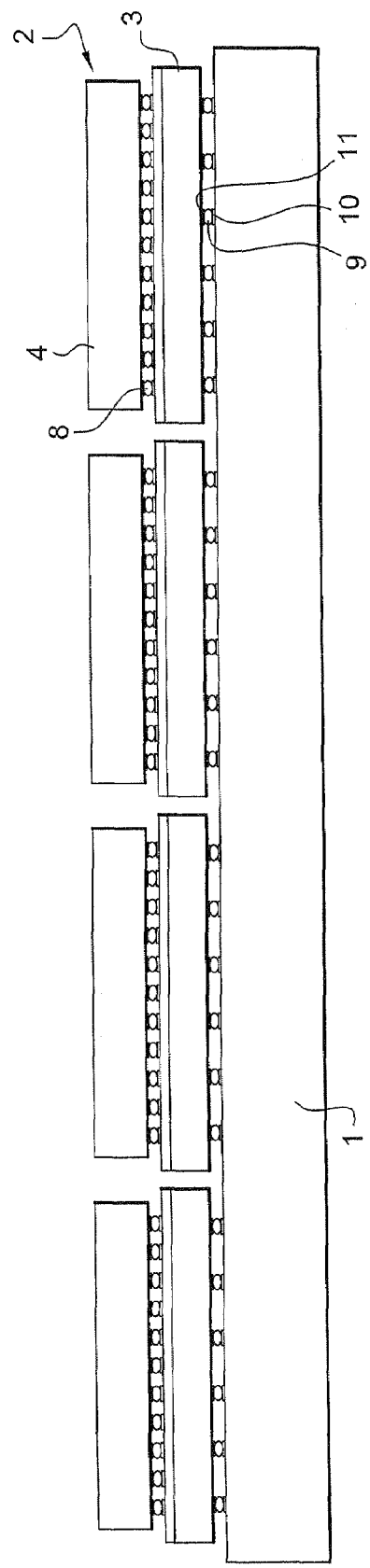
FIG. 3 is a schematic longitudinal cross-sectional view of another technology according to the prior art which uses hybridization to attach the elementary modules to the interconnect substrate.

The description of the invention relates more particularly to infrared detectors. It is nevertheless obvious that the invention has applications other than this particular application and that the invention can be used for any type of electromagnetic radiation, especially radiation in the visible spectrum. The production of the elementary detection modules 2 in accordance with the present invention is described first. Firstly, the reader is reminded that, as shown in FIGS. 1 and 2 which depict the prior state of the art, it is possible to hybridize several detection circuits 4, 5 on a single read circuit 3, depending on the number of wavelength ranges which the finished detector is designed to detect.

This detection circuit 4 consists, for example, of a first layer of a material which is transparent to infrared radiation having a typical thickness of 200 to 800 micrometers and made of CdTe or CdZnTe for instance. On this first layer, one deposits a second thinner layer of HgCdTe 4' which constitutes the actual detection layer by using epitaxy or molecular jet epitaxy for example. This layer is therefore located on the front face of the detection circuit. These are devices which have an illuminated rear face.

On this front face, one mounts alignment features 13, typically consisting of etched metal or metals, whereof the accurate geometries and positioning are obtained by photolithography. These features are produced during the detection-circuit fabrication process.

As a result, read circuit 3 consists of a thinned silicone stack 3' which constitutes the front face of the read circuit on a thicker layer of germanium. A rigid joint between these two materials is ensured either by using epoxy adhesive or by molecular adhesion in a known manner.

Registration features 14 designed to facilitate positioning of the detection circuit on the read circuit during the subsequent hybridization phase are also applied on the front face of read circuit 3' and hence on the silicon layer.

At the same time and in a known manner, in order to carry out this hybridization, wettability surfaces are also applied to the front face of the detection circuit and to the front face of the read circuit respectively, in line with each other, in order to improve the adhesion of the indium microbumps 8.

In order to facilitate accurate X and Y positioning of the detection circuit on the read circuit, alignment features 13 are located in line with the alignment features 14 of the read circuit.

To achieve this, a flip chip bonder is used such as that marketed under the name SUSS MICROTEC FC 150, for example, which ensures deposition with an X and Y accuracy of approximately 1.0 μm and simultaneous hybridization of the detection circuit or circuits on the read circuit. This way, one obtains an elementary module 2 in accordance with the invention.

Figure 5:
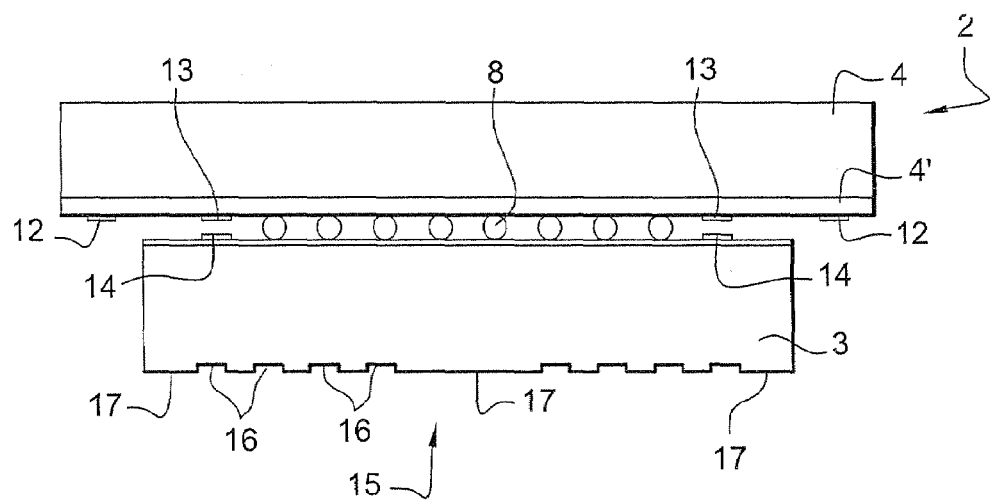
FIG. 5 is a view similar to FIG. 4 showing a second stage in the production of said module.

One then performs (FIG. 5) one of the stages of the method according to the invention which involves grooving the rear face of read circuit 3. This grooving produces slots 16 intended to allow the migration of adhesive, especially due to capillary action, which is required in order to secure the elementary module on interconnect substrate 1.

This grooving is carried out by sawing or laser engraving for example. The size and the pitch of these grooves are adapted and determined, in a manner which is elementary to those skilled in the art, for the chosen product in order to ensure retention of the elementary module on the interconnect substrate. At the same time and as it is apparent in FIG. 5, some areas 17 of said rear face 15 of read circuit 3 do not have such slots. These areas 17 are designed, as described below, to come into direct contact with interconnect substrate 1 and also to be used as a suction area capable of maintaining the elementary module in a precise position, especially during curing of the adhesive which flows through said slots or grooves 16.

Substrate 1, which is also referred to as an interconnect network, advantageously has a coefficient of thermal expansion, in the temperature range 80 K-400/450 K, which is very close to that of germanium which constitutes the substrate which is press bonded to thinned silicon 3'. It is even extremely useful to choose an interconnect substrate made of germanium. In fact, besides the fact that no bimetallic effect is observed between the read circuit and the interconnect substrate, using germanium is compatible with the processing operations carried out on silicon-foundry production lines, especially for depositing metals and the photolithography operations which are required in order to obtain the registration features. The reader is reminded that 80 K is the detector's operating temperature and 400 K is the temperature which can be used for bonding.

In a known manner, the interconnect substrate is designed to fulfill two essential functions:
- allow the accurate positioning of elementary modules 2 in the X, Y plane;
- allow retention of said elementary modules which are accurately placed when they are attached to said substrate.

Because of the direct interaction between areas 17 of rear face 15 of read circuit 3 and the upper face of substrate 1, the latter must be extremely flat, especially its front face. In fact, unevenness of the front face has a direct impact on variation in the Z dimension of the photodiodes which constitute the focal plane.

According to one aspect of the invention, this interconnect substrate also has, on its front face, alignment features 18 positioned in line with alignment features 12 mounted on the front face of the detection circuits, as described below, or on an inactive component in the plane of detection which is hybridized on the read circuit.

It is actually the accurate positioning of these alignment features 18 on the registration substrate which make it possible to accurately position elementary modules 2, once again using a SUSS MICROTEC FC 150 type flip chip bonder.

Figure 8:
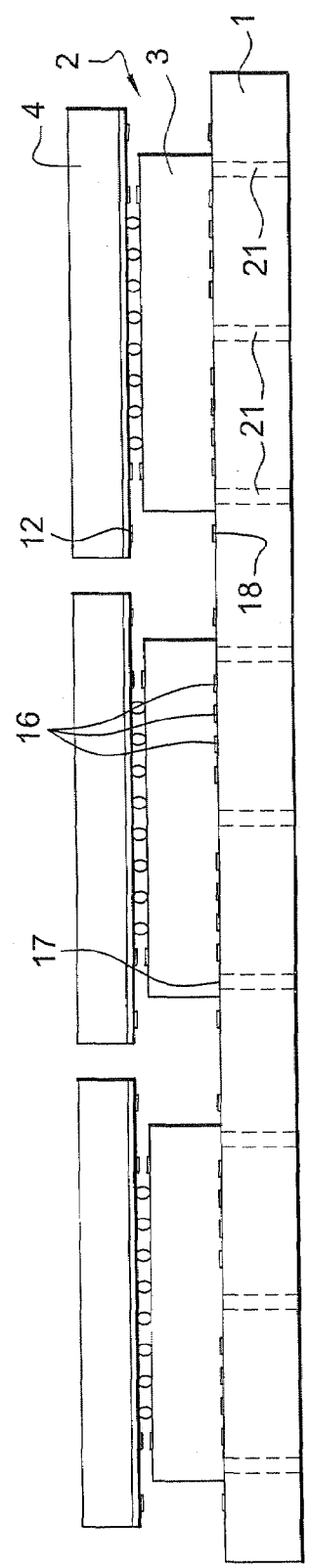
FIG. 8 shows the final stage in producing the detector in accordance with the invention after removing the tooling.
Figure 9:
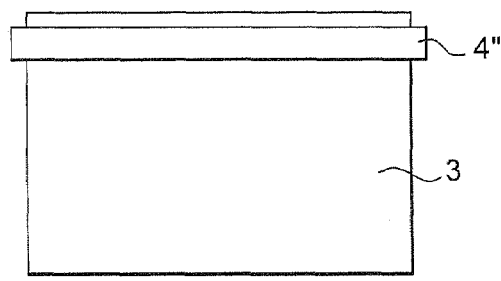
FIGS. 9 and 10 are schematic top views of an elementary module according to a first variant of the invention with one and three detection circuits respectively.

At the same time, interconnect substrate 1 is completely pierced by a certain number of pipes 21 which emerge near pipes 23 which are connected to a sequenced vacuum or suction source and are associated with non-standard tooling 19 in accordance with the invention. Thus, as can be seen in FIGS. 7 to 9, pipes 21 inside interconnect substrate 1 emerge on the front face of said substrate in line with areas 17 of rear face 15 of the elementary modules which have no grooves.

Finally, in order to ensure that the interconnect substrate is effectively secured to above-mentioned suction tooling 19, said tooling also comprises suction sources 22 which emerge on the rear face of the interconnect substrate which is now pressed against said tooling during phases when the elementary modules are positioned and curing is performed, as described below.

The method of fabricating an array with a large focal plane in accordance with the invention is succinctly described below.

After hybridizing detection circuit(s) 4, 5 on read circuit 3 and producing elementary modules 2, the components thus produced undergo electro-optical screening. This screening makes it possible to identify those elementary modules which offer electro-optical performance which is compatible with the requirements placed on the finished product.

The rear face of read circuit 3 of each of these elementary modules is then grooved.

Subsequently, the interconnect substrate is produced and, in particular, pipes 21 are drilled and alignment features 18 are accurately positioned on the front face. Tooling 19 which is designed to ensure sequenced suction as the elementary modules are gradually positioned is positioned inside a flip-chip bonding oven of a known type. Interconnect substrate 1 is positioned on this tooling and held on it by switching on suction source 22 which presses substrate 1 against tooling 19.

A first elementary module 2 is then processed by aligning the alignment features 12 of said module with the alignment features 18 of the interconnect substrate. This alignment is achieved by juxtaposing features 12 and 18, using the above-mentioned flip chip bonder in order to do so. Exactly the same procedure is performed when fabricating the elementary modules (features 13 and 14). This is one of the basic functions of flip chip bonding equipment.

Once this alignment has been obtained, said elementary module is actually deposited on the network or interconnect substrate with corresponding switching of the vacuum or suction by suction source 20. The first module thus deposited is therefore kept pressed in the position defined by this negative pressure or suction and one can gradually deposit the next n successive elementary modules by using n suction channel (s) 20.

Once all the elementary modules 2 have been thus positioned and pressed against interconnect substrate 1, epoxy adhesive is injected into the various grooves 16 until the adhesive migrates completely into the grooves thus defined due to the effect of capillary action.

The curing cycle is then started, using the above-mentioned flip chip bonding oven. This cycle may, however, be incomplete because its function is confined to immobilizing the structure in order to prevent any movement of the elementary modules when the focal plane is recovered. This is, in the parlance of the trade, "pre-curing" or "incomplete curing", the purpose of which is to ensure that the assembled structure is immobilized without the adhesive having the mechanical properties obtained by complete curing. This complete cycle can nevertheless be started in the flip chip bonding oven.

Vacuum or suction sources 20 are then switched off. The array thus produced can then be removed from the flip chip bonding oven as shown schematically in FIG. 9 and the curing cycle can be completed if applicable after adding additional adhesive in equipment which is conventionally used (a stove for example).

According to a first embodiment, the method thus described imposes a prior dimensional constraint on the geometry of the detection circuit. More exactly, this requirement relates to only one of the various detection circuits which are capable of being coupled or hybridized to a single read circuit.

Figure 10:
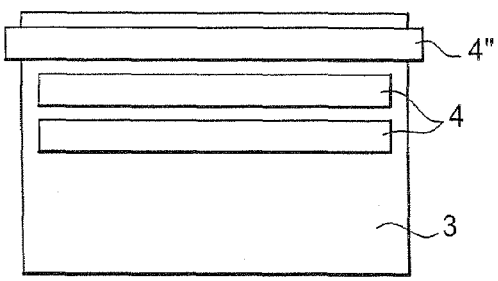

As shown schematically in FIGS. 9 and 10, it is apparent that the length of at least one (4") of the detection circuits is greater than that of the read circuit 3 on which it used to be hybridized.

In fact, it is useful to be able to place alignment features 12 on the front face of this particular detection circuit 4" in order to allow, when using the method according to the invention, alignment of the detection module on the interconnect substrate.

Figure 11:
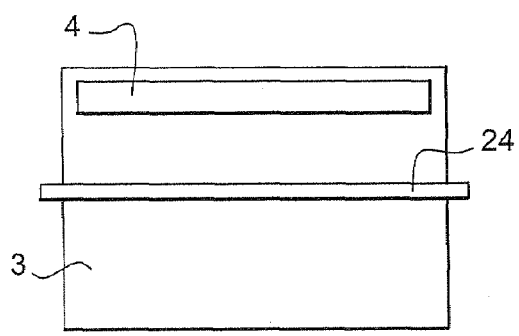
FIGS. 11 and 12 are views similar to FIGS. 9 and 10 of a second variant of the invention which uses an inactive component on the detection plane, this component being hybridized on the read circuit.
Figure 12:
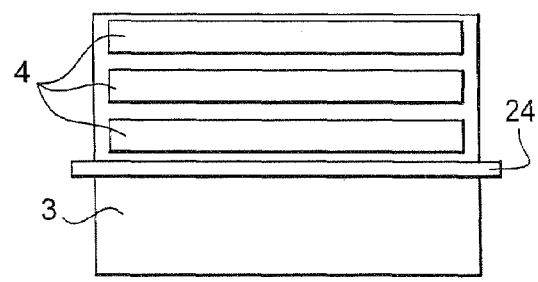
Figure 13:
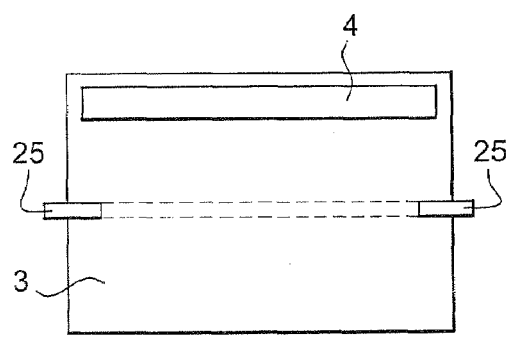
FIGS. 13 and 14 are views similar to FIGS. 11 and 12 of a third variant of the invention which also uses an inactive component on the detection plane, this component being hybridized on the read circuit.
Figure 14:
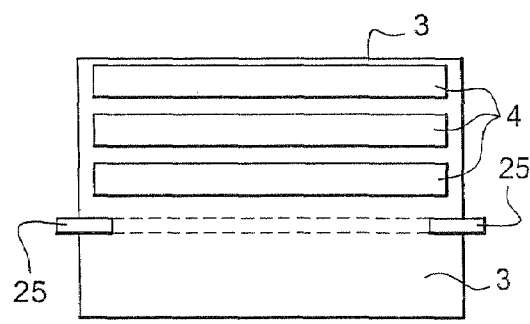

According to another embodiment of the invention, it is possible to overcome this constraint on the detection circuit by using a component 24, the function of which is purely mechanical, namely to transfer the alignment features. Such components can be temporarily hybridized on the read circuit and are then removed at the end of the process (see FIGS. 11 and 12; 13 and 14).

Projection beyond the read circuit of a part of the active structure of the sensing element always poses a risk during handling, assembly, etc. It is preferable that this alignment-feature transfer function is fulfilled by a part which is purely mechanical.

Figure 4:
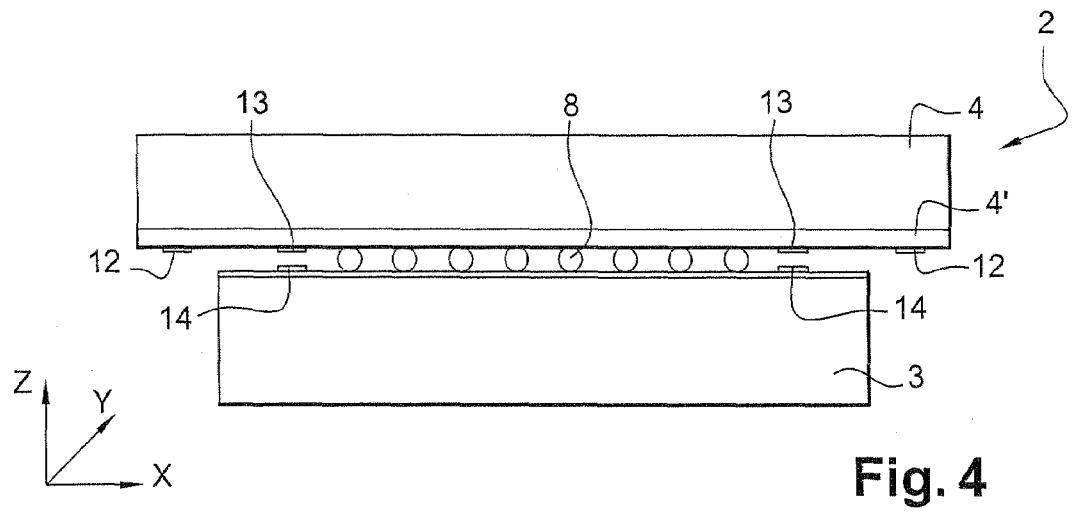
FIG. 4 is a schematic cross-sectional view illustrating a first stage in fabricating an elementary module.

In addition, it may be desirable, in some applications, to have to remove the support substrate of the sensing element (4 in FIG. 4). Such removal generally necessitates prior potting (using epoxy adhesive) of the connector and wiring area located between the detection circuit and the read circuit (4+4' and 3 in FIG. 4) in order to ensure adequate mechanical strength of the extremely thin active part 4' by a rigid joint with the read circuit. Potting this area assumes that the dimension of the detection circuit is less than that of the read circuit and that transfer of the registration features is ensured by a part which is not active.

It is apparent that the attraction of the method according to the invention is that it makes it possible to satisfy the accuracy constraints imposed by the systems in the three X, Y and Z dimensions because there is no longer any interaction with the adhesive film which separates the elementary modules from the substrate. The adhesive used admittedly fulfils an attachment function but, as it will have been appreciated, the modules rest directly on the front face of said interconnect substrate in those areas which have no grooves. This way one ensures perfect parallelism between the support faces and, consequently, excellent flatness of the focal plane thus produced.

At the same time, the method uses flip chip bonders and aligners which are already familiar to and controllable by those skilled in the art.

This being so, it becomes possible to produce detection arrays with a large focal plane effectively and without affecting detection quality and accuracy.

The invention claimed is:

1. A method for producing an array for detecting electromagnetic radiation said array consisting of a plurality of elementary detection modules mounted on an interconnect substrate and said modules themselves comprising at least one circuit for detecting said radiation, connected to a read circuit by hybridization, said read circuits themselves being attached to interconnect substrate, wherein the method comprises:

making, on the rear face of read circuit of each of the elementary modules:
grooves or slots designed to allow migration of an adhesive capable of ensuring attachment of said modules on interconnect substrate,
and areas without such grooves or slots in order to allow direct contact between said modules and said interconnect substrate;
mounting, firstly on the front face of interconnect substrate, and secondly on the front face of the detection circuit, registration features capable of ensuring accurate positioning, on the X and Y axes, of each of the elementary modules on said interconnect substrate;
bringing about pressing of each of the elementary modules onto interconnect substrate after positioning of said modules, areas which have no grooves or slots on the rear face of read circuit then being in direct contact with interconnect substrate;
ensuring migration of the adhesive through grooves or slots provided for this purpose;
raising the temperature of the chamber used to produce said array in order to cause curing of the adhesive.

2. A method for producing an array for detecting electromagnetic radiation as claimed in claim 1, wherein the elementary modules are kept pressed against the interconnect substrate by applying negative pressure or suction to said modules, the substrate being pierced by pipes connected to one or more vacuum or suction sources, said pipes emerge on the front face of interconnect substrate in line with areas of the rear face of elementary modules which have no grooves or slots.

3. A method for producing an array for detecting electromagnetic radiation as claimed in claim 1, wherein alignment of detection circuit(s) on a single read circuit is obtained by using registration features positioned respectively on the front face of the read circuit and on the rear face of the detection circuit(s).

4. A method for producing an array for detecting electromagnetic radiation as claimed in claim 1, wherein at least one of the detection circuits of a single elementary module has a length such that it projects either side of the said module in order to make it possible to produce, on its rear face, registration feature allowing it to be positioned accurately on the registration substrate which is also provided with registration features.

5. A method for producing an array for detecting electromagnetic radiation as claimed in claim 1, wherein one mounts, on read circuit, a component, the length of which also projects either side of the read circuit and which is intended to receive registration feature, this component being temporarily hybridized on the read circuit.

6. A method for producing an array for detecting infrared radiation, said array consisting of a plurality of elementary detection modules mounted on an interconnect substrate and said modules themselves comprising at least one circuit for detecting said radiation, connected to a read circuit by hybridization, said read circuits themselves being attached to interconnect substrate, wherein the method comprises:

making, on the rear face of read circuit of each of the elementary modules:
  grooves or slots designed to allow migration of an adhesive capable of ensuring attachment of said modules on interconnect substrate,
  and areas without such grooves or slots in order to allow direct contact between said modules and said interconnect substrate;
mounting, firstly on the front face of interconnect substrate, and secondly on the front face of the detection circuit, registration features capable of ensuring accurate positioning, on the X and Y axes, of each of the elementary modules on said interconnect substrate;
bringing about pressing of each of the elementary modules onto interconnect substrate after positioning of said modules, areas which have no grooves or slots on the rear face of read circuit then being in direct contact with interconnect substrate;
ensuring migration of the adhesive through grooves or slots provided for this purpose;
raising the temperature of the chamber used to produce said array in order to cause curing of the adhesive.

* * * * *